US006777733B2

(12) United States Patent
Mandelman et al.

(10) Patent No.: US 6,777,733 B2
(45) Date of Patent: Aug. 17, 2004

(54) METHOD FOR FORMING DUAL WORKFUNCTION HIGH-PERFORMANCE SUPPORT MOSFETS IN EDRAM ARRAYS

(75) Inventors: Jack A. Mandelman, Stormville, NY (US); Ramachandra Divakaruni, Somers, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/862,827

(22) Filed: May 22, 2001

(65) Prior Publication Data

US 2002/0055224 A1 May 9, 2002

Related U.S. Application Data

(62) Division of application No. 09/706,492, filed on Nov. 3, 2000, now Pat. No. 6,261,894.

(51) Int. Cl.⁷ ........................ H01L 27/108; H01L 29/76; H01L 29/94; H01L 31/119
(52) U.S. Cl. ........................ 257/296; 257/409; 257/301; 257/302
(58) Field of Search ................................ 257/296, 301, 257/308, 127, 170, 339, 409, 372–376, 394–400, 452, 482, 493–495, 490, 605, 302, 313

(56) References Cited

U.S. PATENT DOCUMENTS

| | | | |
|---|---|---|---|
| 5,474,946 A | * 12/1995 | Ajit et al. ...................... 437/41 |
| 5,525,531 A | * 6/1996 | Bronner et al. ................ 437/52 |
| 5,773,314 A | 6/1998 | Jiang et al. | |
| 5,897,371 A | * 4/1999 | Yeh et al. .................... 438/633 |
| 5,903,493 A | 5/1999 | Lee | |
| 5,920,779 A | 7/1999 | Sun et al. | |
| 5,945,704 A | * 8/1999 | Schrems et al. ............. 257/301 |
| 6,017,790 A | 1/2000 | Liou et al. | |
| 6,060,349 A | 5/2000 | Peng et al. | |
| 6,069,037 A | 5/2000 | Liao | |
| 6,072,210 A | 6/2000 | Choi | |
| 6,075,720 A | * 6/2000 | Leung et al. ................ 365/149 |
| 6,107,154 A | 8/2000 | Lin | |
| 6,111,283 A | 8/2000 | Yang et al. | |
| 6,133,130 A | 10/2000 | Lin et al. | |
| 6,136,638 A | 10/2000 | Lee et al. | |
| 6,146,970 A | * 11/2000 | Witek et al. ................. 438/424 |
| 6,168,984 B1 | 1/2001 | Yoo et al. | |
| 6,172,387 B1 | 1/2001 | Thakur et al. | |
| 6,174,756 B1 | * 1/2001 | Gambino et al. ........... 438/163 |
| 6,177,319 B1 | 1/2001 | Chen | |
| 6,177,340 B1 | 1/2001 | Yoo et al. | |
| 6,200,848 B1 | 3/2001 | Lin et al. | |
| 6,207,492 B1 | 3/2001 | Tzeng et al. | |
| 6,274,471 B1 | * 8/2001 | Huang ......................... 438/597 |
| 6,291,335 B1 | * 9/2001 | Schnabel et al. ............ 438/626 |
| 6,407,421 B1 | * 6/2002 | Liu et al. ..................... 257/296 |
| 2002/0096710 A1 | * 7/2002 | Inagawa et al. ............. 257/330 |

* cited by examiner

*Primary Examiner*—Mary Wilczewski
*Assistant Examiner*—Monica Lewis
(74) *Attorney, Agent, or Firm*—Scully, Scott, Murphy & Presser; Todd C. Li, Esq.

(57) ABSTRACT

Methods of preparing dual workfunction high-performance support metal oxide semiconductor field effect transistor (MOSFETs)/embedded dynamic random access (EDRAM) arrays are provided. The methods describe herein reduce the number of deep-UV masks used in forming the memory structure, decouple the support and arraying processing steps, provide salicided gates, source/drain regions and bitlines, and provide, in some instances, local interconnects at no additional processing costs. Dual workfunction high-performance support MOSFETs/EDRAM arrays having a gate conductor guard ring and/or local interconnections are also provided.

4 Claims, 14 Drawing Sheets

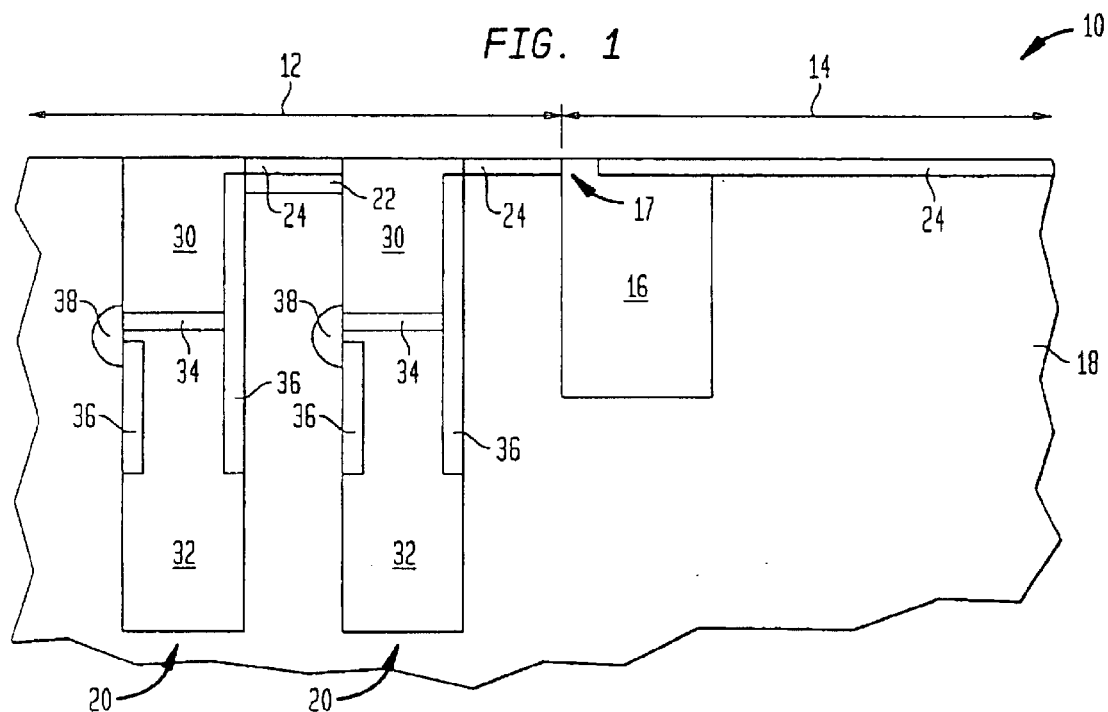
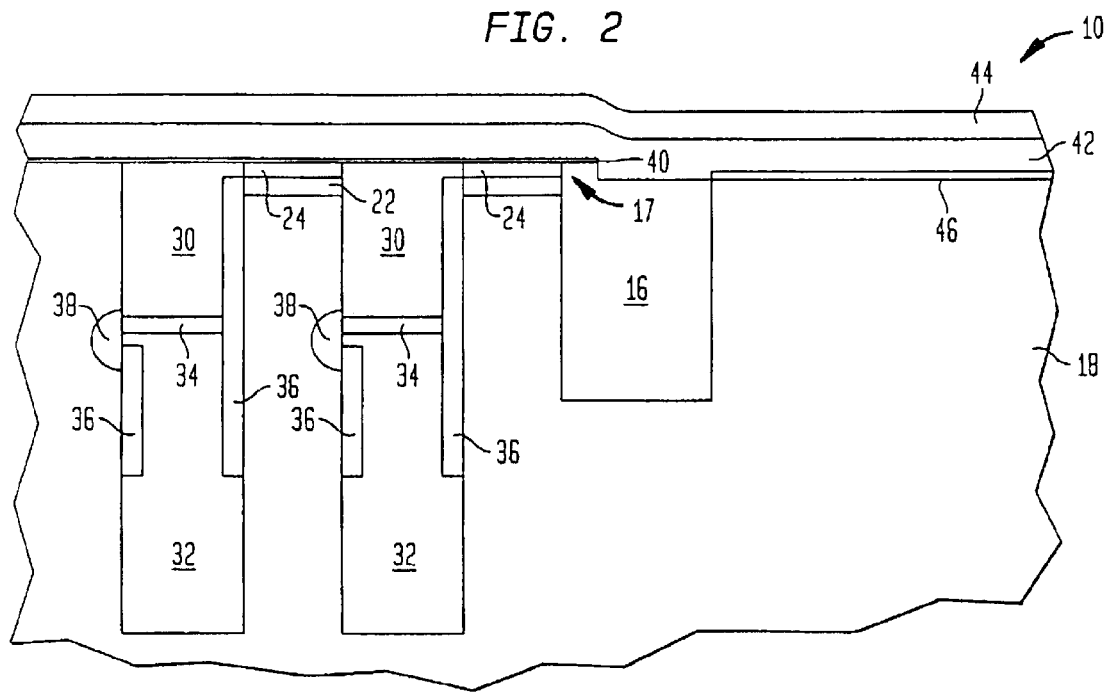

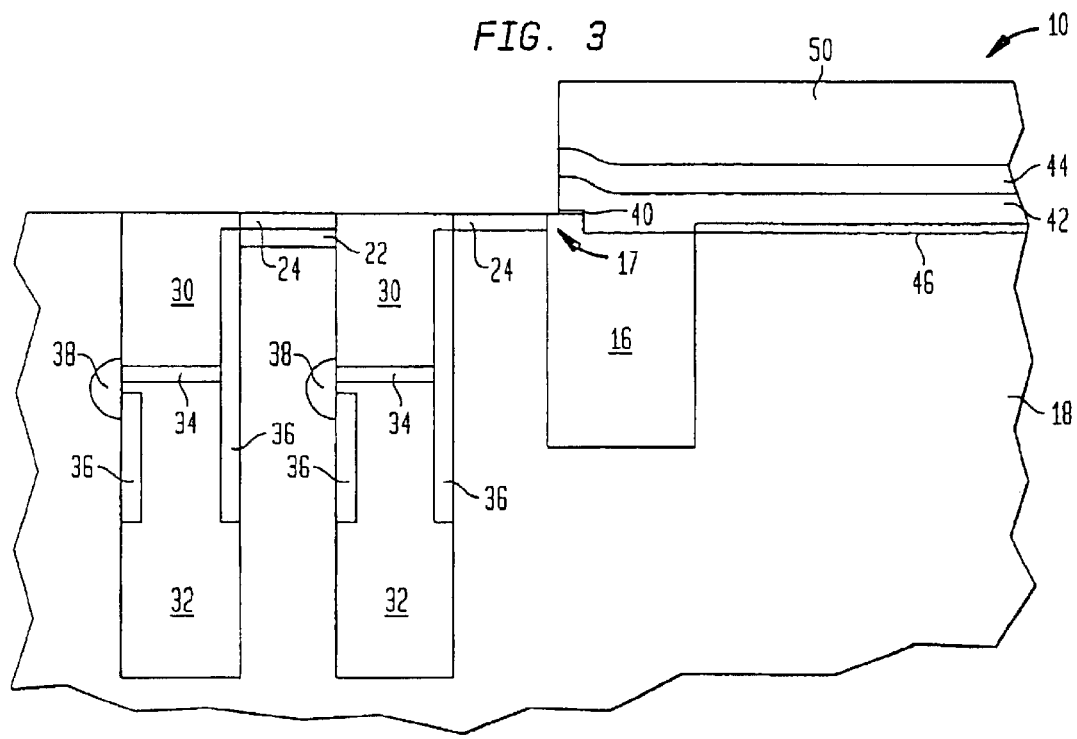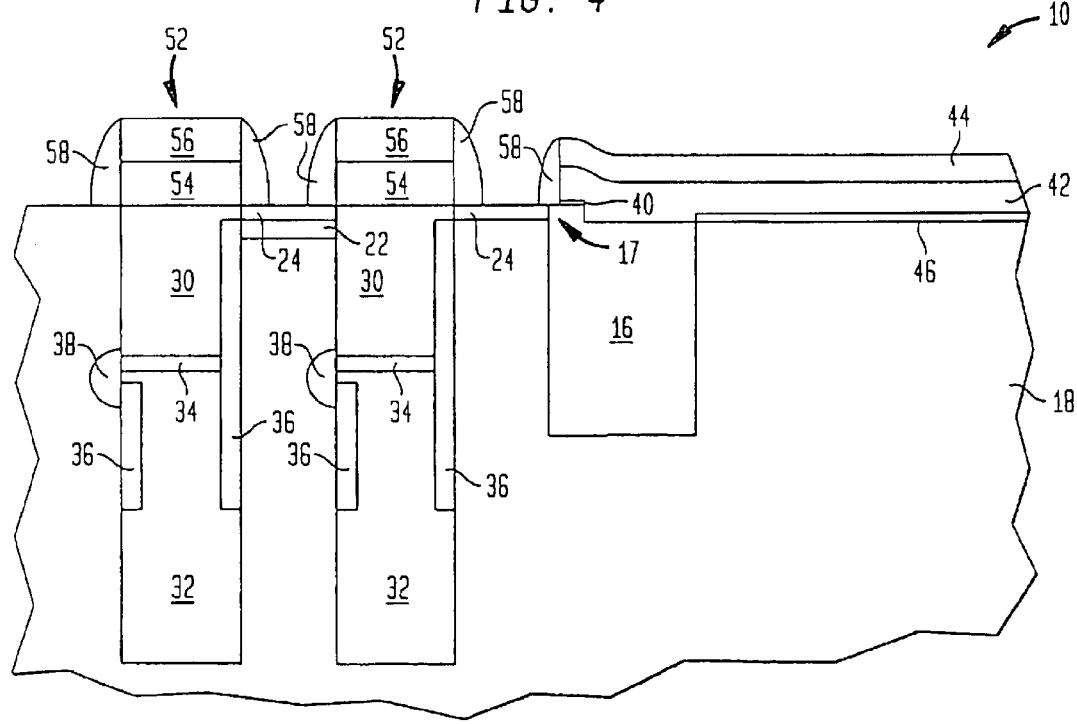

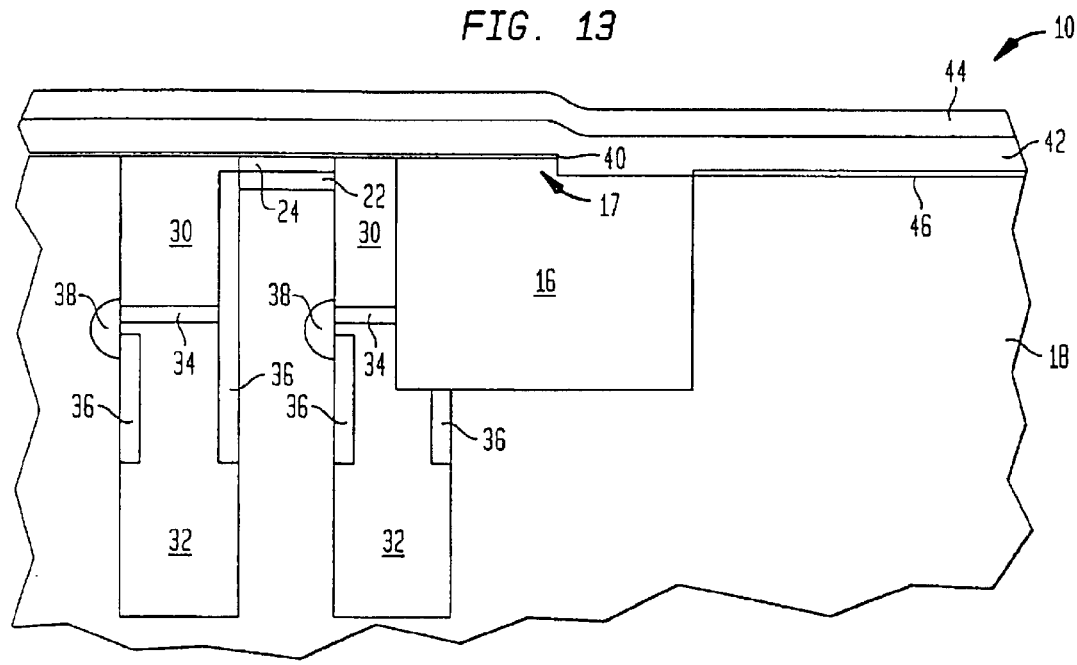
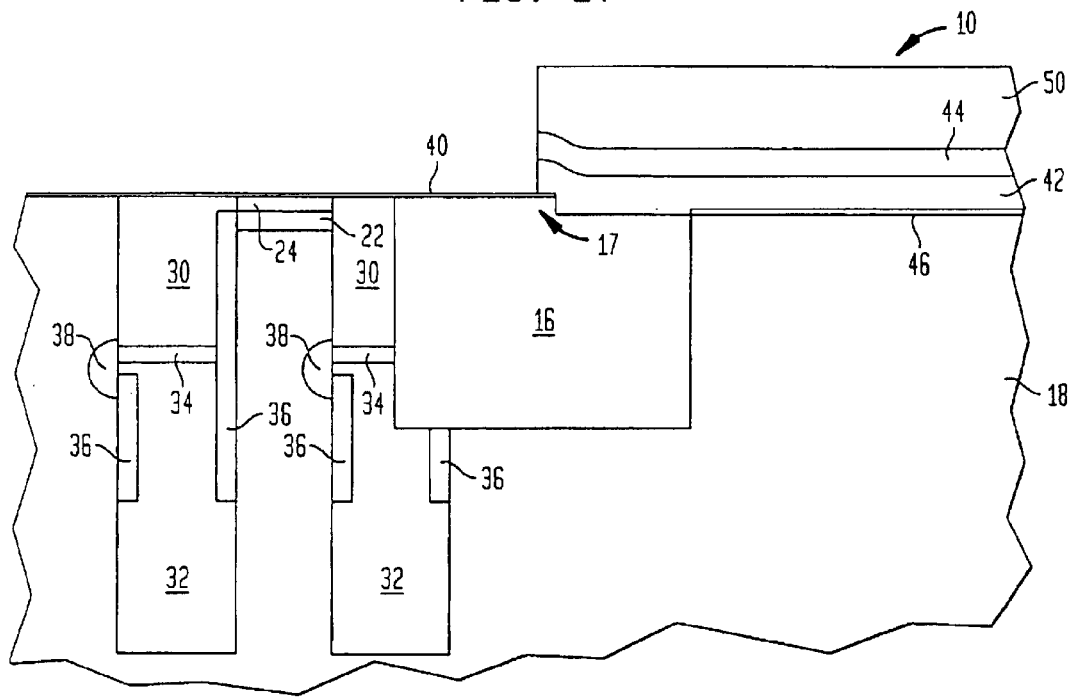

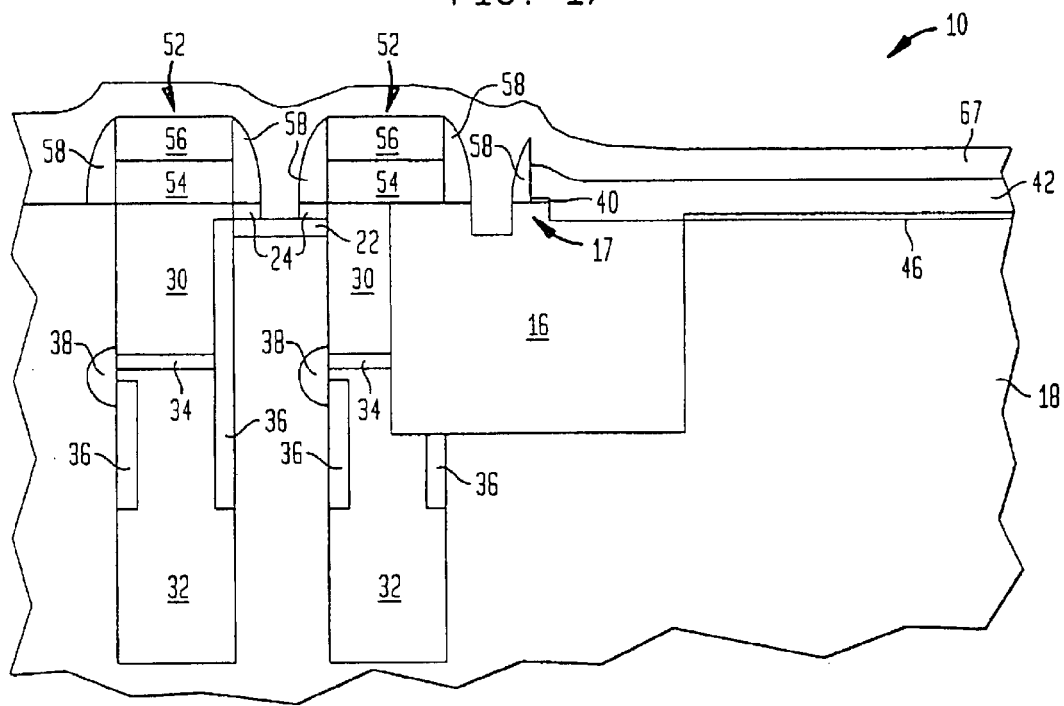
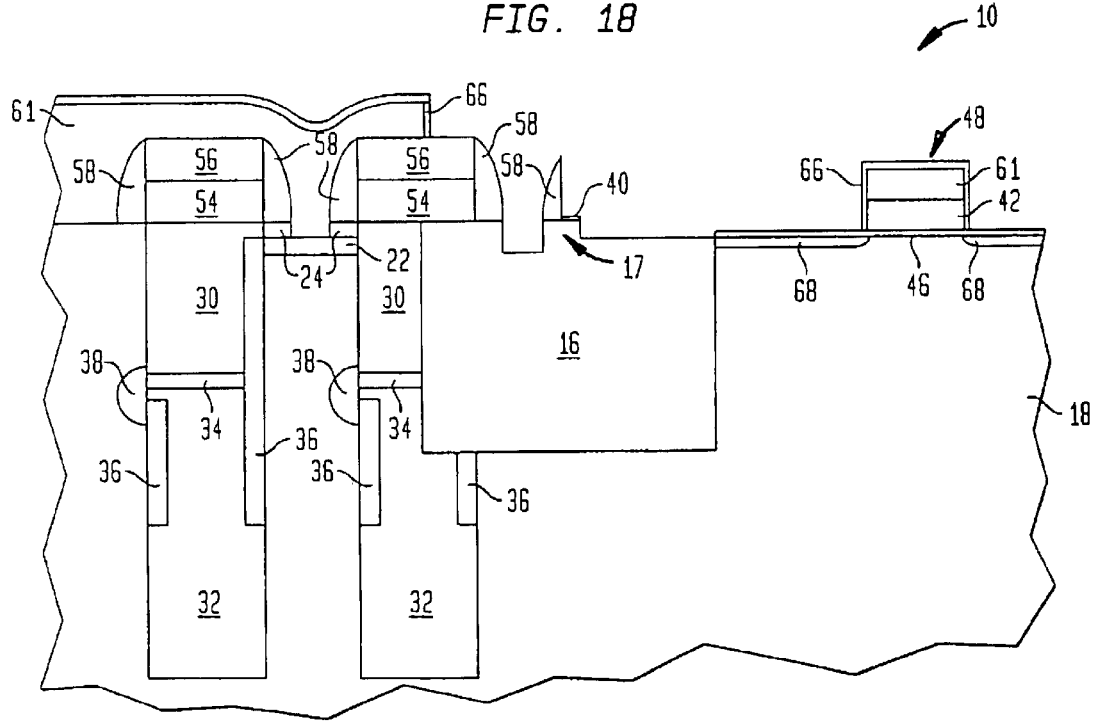

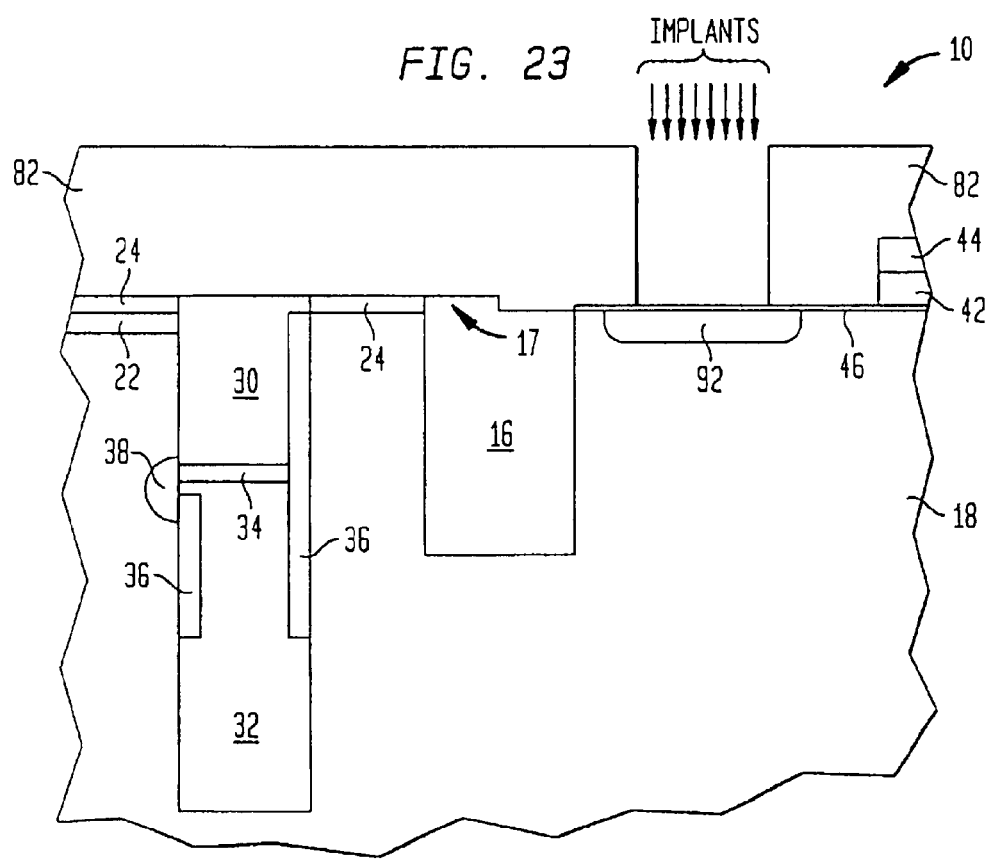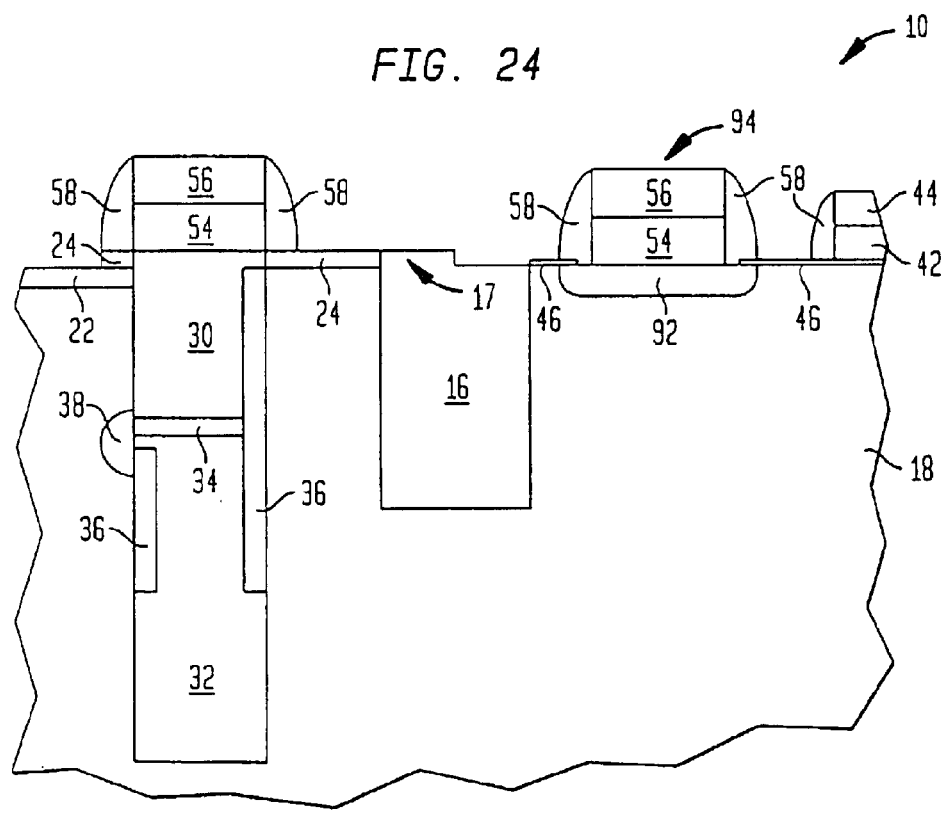

METHOD FOR FORMING DUAL WORKFUNCTION HIGH-PERFORMANCE SUPPORT MOSFETS IN EDRAM ARRAYS

This application is a division of U.S. application Ser. No. 09/706,492 filed on Nov. 3, 2000 now U.S. Pat. No. 6,261,894.

FIELD OF THE INVENTION

The present invention relates to semiconductor memory device manufacturing, and more particular to methods of forming dual workfunction high-performance support MOSFETs (metal oxide semiconductor field effect transistors) in an EDRAM (embedded dynamic random access memory) array.

BACKGROUND OF THE INVENTION

Embedded DRAM applications demand both the utmost in high-performance CMOS (complementary metal oxide semiconductor) logic devices and high-density DRAM arrays. High-performance CMOS logic devices require low-resistance (on the order of 5 ohms/sq. or below) gate conductors and source/drain diffusions (salicidation), which drive processes that are costly and difficult to integrate with high-density DRAM processes. For example, salicided gates and source/drain regions greatly complicate the processes for forming array MOSFETs since the array MOSFETs need bitline contacts which are borderless to adjacent wordline conductors; also, salicided junctions in the array may result in increased current leakage of the memory device.

In a typical DRAM array, the wordlines need to be capped with an insulator, while in the supports the gate conductors must be exposed to allow the introduction of dual workfunction doping and salicidation. Conventional solutions to these integration problems require additional masking steps to remove the insulating gate cap from the support MOSFETs prior to the salicidation process.

Another problem encountered in prior art processes is the lithography steps used to simultaneously form support gates and wordlines: optimization of support gate lithography results in difficulties with defining wordlines in the array which are on a 2F pitch.

Yet another problem with prior art processes is in the formation of local interconnects. Specifically, in the prior art one of the metallization levels, i.e., the M0 level, is used for both the bitline and for forming local interconnects. In the present invention, the conventional M0 metal is not required since the bitlines and local interconnects are formed by the salicidation of polysilicon.

In view of the drawbacks mentioned hereinabove with prior art processes of forming dual workfunction high-performance support MOSFETs in EDRAM arrays, there is a need for developing new and improved methods of manufacturing the same. That is, new and improved methods are needed for integrating high-performance CMOS logic devices with dense array MOSFET DRAM cells.

SUMMARY OF THE INVENTION

One object of the present invention is to provide a method of manufacturing a dual workfunction high-performance support MOSFETIEDRAM array in which the need for additional masking steps to form the high-performance CMOS logic devices and borderless contacts are eliminated.

A further object of the present invention is to provide a method of manufacturing a dual workfunction high-performance support MOSFET/EDRAM array wherein the method does not share support gate conductor lithography with wordline lithography.

A still further object of the present invention is to provide a method of manufacturing a dual workfunction high-performance support MOSFETIEDRAM array wherein the gate conductor lithography is shared with the array bitline lithography step. Sharing of a single masking step for the support gate conductor and array bitlines results in the saving of a deep-UV mask and is less demanding due to its 3F pitch.

A yet further object of the present invention is to provide a method of manufacturing a dual workfunction high-performance support MOSFET/EDRAM array which does not use an M0 level for the local interconnect.

Another object of the present invention is to provide a dual workfunction high performance support MOSFET/EDRAM array in which a gate conductor guard ring is formed around the array region of the structure so as to avoid trapping of a stringer of polysilicon in the isolation region. The presence of the guard ring provides an internal protection scheme, which prevents the designer from placing a gate conductor across the isolation region.

An even further object of the present invention is to provide a dual workfunction high performance support MOSFET/EDRAM array comprising a local interconnect which is formed concurrently, and of the same low-resistance material, as the gate conductor in the array region.

These and other objects and advantages are achieved in the present invention by employing one of the following three processing schemes which are each capable of integrating high-performance CMOS logic devices with dense array MOSFET DRAM cells. It should be noted that the present invention contemplates the formation of vertical and planar MOSFET arrays, with vertical MOSFET arrays being more preferable than planar MOSFET arrays. Therefore, although the following is specific to vertical MOSFET arrays, the processing steps used each of the three embodiments can be used in making planar MOSFET arrays.

In accordance with a first embodiment of the present invention, a process of forming a dual workfunction high-performance support MOSFET/EDRAM vertical (or planar) array memory structure having a gate conductor guard ring formed around the array region is provided. The gate conductor guard ring is a consequence of a ground rule that guarantees that a strip of gate conductor polysilicon remains above the isolation region surrounding the array.

Specifically, the first embodiment of the present invention comprises the steps of:

(a) providing a memory structure having at least one array region and at least one support region, wherein said at least one array region and said at least one support region are separated by an isolation region, wherein said at least one array region includes a plurality of dynamic random access memory (DRAM) cells embedded in a substrate, wherein adjacent DRAM cells are connected to each other through bitline diffusion regions which are capped with an oxide capping layer;

(b) forming a patterned nitride layer on all exposed surfaces in said at least one array region and on a portion of said isolation region;

(c) forming a gate oxide on said substrate in said at least one support region;

(d) forming a stack comprising a first polysilicon layer and a dielectric capping layer on all exposed surfaces of said memory structure;

(e) removing said dielectric capping layer, said first polysilicon layer and said nitride layer from said at least one array region;

(f) forming wordlines over said plurality of DRAM cells in said at least one array region;

(g) forming spacers on exposed sidewalls of said wordlines in said at least one array region as well as on exposed sidewalls of said stack remaining in said structure;

(h) forming a block mask over the at least one support region and at least a portion of one of said DRAM cells that is adjacent to said isolation region, whereby said block mask does not cover said oxide capping layer;

(i) removing said oxide capping layer over said bitline diffusion regions and stripping said block mask;

(j) forming a patterned second polysilicon layer over the at least one array region and said stack which is present on said isolation region, and removing said dielectric capping layer in said at least one support region;

(k) forming a doped glass material layer over all surfaces in said at least one array region and said at least one support region;

(l) patterning said doped glass material layer so as to form hard masks in said at least one array region and said at least one support region, whereby said hard mask in said at least one array region defines a bitline of the memory structure and said hard mask in said at least one support region defines a support gate region;

(m) removing exposed second polysilicon layer from said at least one array region and said isolation region, while simultaneously removing exposed portions of said first polysilicon layer in said at least one support region, whereby a gate conductor guard ring is formed on said isolation region and said support gate region is formed in said at least one support region;

(n) removing said hard masks from said at least one array region and from said at least one support region and forming a screen oxide layer on any exposed silicon surfaces;

(o) forming source and drain regions about said support gate region; and (p) removing oxide overlying said bitline, support gate region, and source and drain regions so as to expose silicon surfaces and saliciding the exposed silicon surfaces so as to provide salicide regions over said bitline, said gate region and said source and drain regions.

A further processing step of the first embodiment of the present invention includes forming a patterned dielectric having via openings overlying the memory structure provided in step (p) above. The via openings allow for the formation of contacts to the support gate region.

In a second embodiment of the present invention, an array/support transition region, which does not contain a gate conductor guard ring over the isolation region around the perimeter of the array, is provided. In this embodiment, the block mask used to protect areas outside of the array during the removal of the oxide layer in the first embodiment is eliminated. Furthermore, the dielectric cap protecting the support polysilicon is removed early in this embodiment. These changes result in improved planarity, eliminating the need for planarizing the doped glass layer. Thus, the support gate stack height, which needs to be patterned, is significantly reduced resulting in improved linewidth control.

The second embodiment of the present invention comprises the steps of:

(a) providing a memory structure having at least one array region and at least one support region, wherein said at least one array region and said at least one support region are separated by an isolation region, wherein said at least one array region includes a plurality of dynamic random access memory (DRAM) cells embedded in a substrate, wherein adjacent DRAM cells are connected to each other through bitline diffusion regions which are capped with an oxide capping layer;

(b) forming a patterned nitride layer on all exposed surfaces in said at least one array region and on a portion of said isolation region;

(c) forming a gate oxide on said substrate in said at least one support region;

(d) forming a stack comprising a first polysilicon layer and a dielectric capping layer on all exposed surfaces of said memory structure;

(e) removing said dielectric capping layer, said first polysilicon layer and said nitride layer from said at least one array region;

(f) forming wordlines over said plurality of DRAM cells in said at least one array region;

(g) forming spacers on exposed sidewalls of said wordlines in said at least one array region as well as on exposed sidewalls of said stack remaining in said structure;

(h) anisotropically etching said memory structure so as to remove said oxide capping layer thereby exposing said bitline diffusion regions in said at least one array region, while simultaneously removing said dielectric capping layer over said isolation region and in said at least one support region;

(i) depositing an undoped layer of polysilicon over all exposed surfaces of said memory structure;

(j) patterning said undoped layer of polysilicon so as to simultaneously form a bitline in said at least one array region and a gate region in said at least one support region;

(k) forming a screen oxide layer on any exposed silicon surfaces;

(l) forming sidewall spacers about said gate region;

(m) forming source and drain regions about said gate region; and (n) removing oxide overlying said bitline, gate region, and source and drain regions so as to expose silicon surfaces and saliciding said exposed silicon surfaces so as to provide salicide regions over said bitline, said gate region and said source and drain regions.

A further-processing step of the second embodiment of the present invention includes forming a patterned dielectric having via openings overlying the memory structure provided in step (n) above. The via openings allow for the formation of contacts to the support gate region.

The third embodiment of the present invention provides a method for forming a local interconnect wiring level in a dual workfunction high-performance MOSFET/EDRAM array. Specifically, the third embodiment of the present invention comprises the steps of:

(a) providing a memory structure having at least one array region and at least one support region, wherein said at least one array region and said at least one support region are separated by an isolation region, wherein said at least one array region includes a plurality of dynamic random access memory (DRAM) cells embedded in a substrate, wherein adjacent DRAM cells are connected to each other through bitline diffusion regions which are capped with an oxide capping layer;

(b) forming a patterned nitride layer on all exposed surfaces in said at least one array region and on a portion of said isolation region;

(c) forming a gate oxide on said substrate in said at least one support region;

(d) forming a stack comprising a first polysilicon layer and a dielectric capping layer on all exposed surfaces of said memory structure;

(e) removing said dielectric capping layer, said first polysilicon layer and said nitride layer from said at least one array region and a portion of said at least one support region;

(f) doping a portion of said substrate in said support region so as to form a diffusion region for subsequent formation of a local interconnect contact thereon;

(g) forming wordlines over said plurality of DRAM cells in said at least one array region, while simultaneously forming a local interconnect in said at least one support region above said diffusion region, wherein said wordlines and said local interconnect are composed of the same material;

(h) forming spacers on exposed sidewalls of said wordlines in said at least one array region, and said local interconnect and remaining stack in said at least one support region, said remaining stack defining a support gate region of said structure;

(i) removing any exposed oxide over said bitline diffusion regions;

(j) forming a patterned second polysilicon layer over the at least said at least one array region and said stack which is overlaying said isolation region, and removing said dielectric capping layer in said at least one support region;

(k) forming a doped glass material layer over all surfaces in said at least one array region and said at least one support region;

(l) patterning said doped glass material layer so as to form a hard mask in said at least one array region, whereby said hard mask in said at least one array region defines a bitline of the memory structure;

(m) removing said hard mask from said at least one array region and forming an oxide layer on all exposed silicon surfaces;

(n) forming source and drain regions about said gate region; and (p) removing oxide overlying said bitline, support gate region, and source and drain regions so as to expose said silicon surfaces and saliciding said silicon surfaces so as to provide salicide regions over said bitline, said support gate region and said source and drain-regions.

A further processing step of the third embodiment of the present invention includes forming a patterned dielectric having via openings overlying the memory structure provided in step (p) above. The via openings allow for the formation of contacts to the support gate region.

In addition to the above methods, the present invention also contemplates various dual workfunction high-performance support MOSFET/EDRAM array. In one memory structure of the present invention, a guard ring is present around the array region. In another memory cell of the present invention, a local interconnect, which is composed of the same material as that of the wordline, is provided. In yet another memory structure of the present invention, vertical DRAMs are present. In an even further embodiment of the present invention, planar DRAMs are present.

BRIEF DESCRIPTION OF THE DRAWINGS

FIGS. 1–12 are pictorial views illustrating the processing steps that are employed in the first embodiment of the present invention.

FIGS. 13–20 are pictorial views illustrating the processing steps that are employed in the second embodiment of the present invention.

FIGS. 21–27 are pictorial views illustrating the processing steps that are employed in the third embodiment of the present invention.

DETAILED DESCRIPTION OF THE INVENTION

Figure 5:
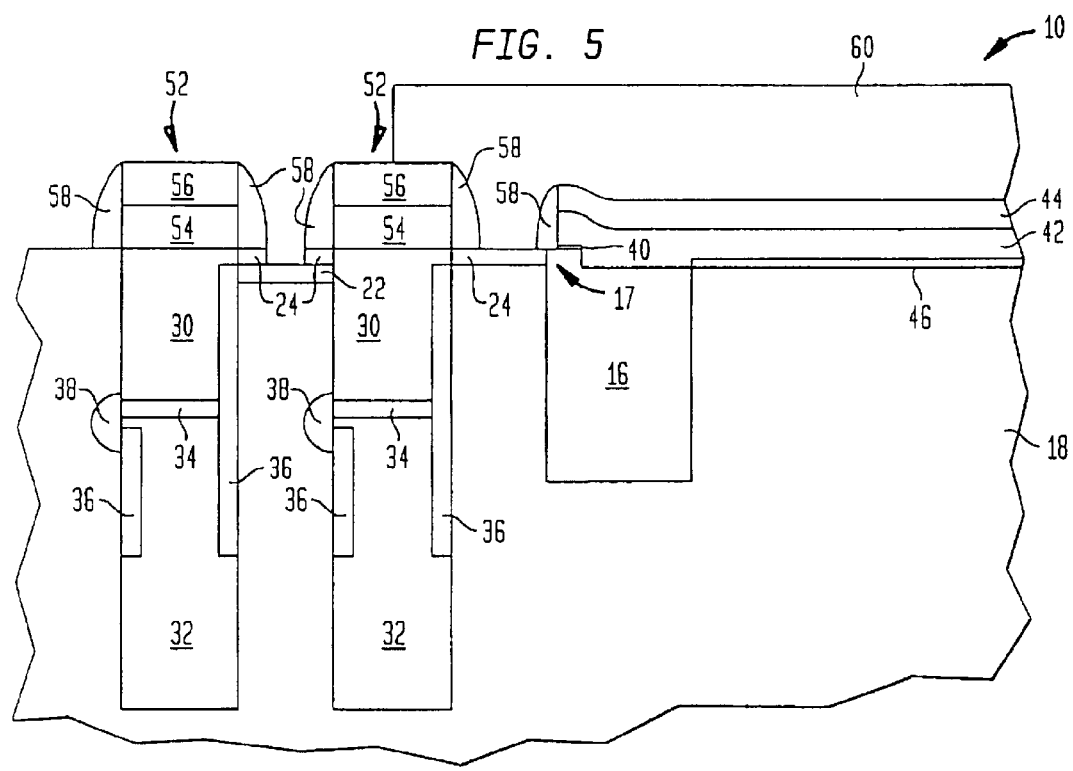

The present invention which provides various processes of forming dual workfunction high-performance support DRAMs/EDRAM arrays will now be described in more detail by referring to the drawings that accompany the present application. It should be noted that in the accompanying drawings, like reference numerals are used for describing like and corresponding elements.

Reference is first made to FIGS. 1–12 which illustrate the various processing steps employed in a first embodiment of the present invention. In the first embodiment, a gate conductor guard ring is formed around the array region as a consequence of a groundrule which guarantees that a strip of gate conductor polysilicon remains above a shallow trench isolation ring surrounding the array. FIG. 1 illustrates an initial memory structure 10 that can be employed in the present invention. Specifically, the initial memory structure shown in FIG. 1 comprises an array region 12 and a support region 14. It is noted that although the drawings depicted the presence of only one of each region in the structure, the memory structure may include any number of array regions and support regions therein. Moreover, it is again noted that although the drawings and text are specific for vertical DRAMs, the present invention works equal well for planar DRAMs. As illustrated, array region 12 is separated from support region 14 by isolation region 16. In accordance with the present invention, the isolation region includes a surface step region 17 which is formed during the fabrication of the same. Although the drawings depict the isolation region as a shallow trench isolation (STI) region the invention is not limited to just STI regions. Instead, other means of electrically separating the array region from the support region such as LOCOS (local oxidation of silicon) are also contemplated herein.

The array region of FIG. 1 includes a plurality of vertical DRAMs 20, two of which are shown, in the drawing, embedded in substrate 18. The substrate includes, but is not limited to: any semiconducting material such as Si, SiGe, GaAs, InAs and other like semiconductors. Layered semiconductors such as Si/SiGe and Silicon-On Insulators (SOIs) are also contemplated herein. The substrate in the array region may also include a well region which is formed utilizing conventional ion implantation. For clarity, the array well region is not shown in the drawings of the present invention.

Array region 12 also includes a bitline diffusion region 22 which is formed in semiconductor substrate 18 between two adjacent vertical DRAMs. In accordance with the present invention, the bitline diffusion region serves to electrically connect the two DRAM cells shown in FIG. 1 together. On top of the bitline diffusion as well as other exposed surfaces of the semiconductor substrate is a layer of oxide 24 which is referred to hereinafter as the top trench oxide or TTO for short. As shown, TTO layer 24 is formed on the upper portion of the semiconductor substrate which does not include the DRAMs.

Each DRAM includes a gate conductor 30 formed in the top portion of a deep trench and deep trench polysilicon 32 which is formed in the lower portion of the deep trench. Separating the gate conductor and the deep trench polysilicon is a trench oxide layer 34. Each DRAM shown in FIG. 1 also includes a collar region 36 and a buried out-diffused strap region 38. It is noted that the vertical DRAM cells of the present invention may include other elements that are well known to those skilled in the art, but for clarity, those other elements are not shown in the drawings of the present invention. Also, the present invention is not limited to the exact memory structure shown in FIG. 1. That is, the DRAM cells may also include a buried exterior counterelectrode about the trench, or a counterelectrode formed inside the trench and a node dielectric formed on said counterelectrode. Deep trench polysilicon is formed on the node dielectric. Other memory structures which include the above basic elements, but having a different configuration are also contemplated herein.

The memory structure shown in FIG. 1 is fabricated utilizing conventional processing techniques that are well known to those skilled in the art. Since such processing steps are well known, a detailed description of the same is not provided herein FIG. 2 illustrates the memory structure after various layers have been formed in the support and array regions. Specifically, the memory structure of FIG. 2 includes a patterned nitride layer 40 which is formed on a top surface of the structure in the array region. As shown, a portion of nitride layer 40 is also present on the isolation region. The structure of FIG. 2 also includes a first layer of polysilicon 42 and a dielectric capping layer 44 which are formed on top of the entire structure in both the array and support regions. It is also possible to have a combination of dielectrics for layer 44 to simplify further processing. For example, dielectric 44 can be a layer of tetraethylorthosilicate (TEOS) capped with SiN. It is noted that the structure of FIG. 2 also includes a support well that is formed in the substrate utilizing conventional ion implantation. Like the previous mentioned array well, the support well is not defined in the drawings of the present invention.

The processing steps which are employed in the present invention for forming the structure shown in FIG. 2 will now be described in some detail. First, nitride layer 40 is deposited on both the array and support surfaces utilizing a conventional deposition processes such as chemical vapor deposition (CVD), plasma-assisted CVD, chemical solution deposition, sputtering or other like deposition processes. The thickness of this nitride layer may vary and is not critical to the present invention. The nitride layer is then opened in the support region by forming a photoresist mask, not shown, over the nitride layer in the array region, and thereafter etching the exposed nitride layer in the support region. A sacrificial oxide layer, not shown, is then grown in the support region utilizing a conventional thermal growing process. It is noted that the sacrificial oxide layer serves as an implantation mask for the forming the support well region. The support well is then formed by utilizing a conventional ion implantation process and thereafter the sacrificial oxide layer is removed utilizing a conventional etching process. Support gate oxide or gate dielectric 46 is then formed by a conventional process or thermally in the support region. The equivalent oxide thickness of the support gate oxide or gate dielectric is from about 1.0 to about 15 nm.

After stripping the photoresist covering the array region, first layer of polysilicon 42 is then deposited utilizing a conventional deposition process such as CVD, plasma assisted CVD, sputtering, spin-on coating or other like deposition processes. The thickness of the first polysilicon layer may vary depending on the deposition process employed in forming the same, but typically it has a thickness of from about 10 to about 200 nm.

Dielectric capping layer 44, which may comprise TEOS or another like dielectric material, is then formed on the first polysilicon layer utilizing a conventional deposition process such as CVD. It is also preferable to have a layer of SiN overlying the TEOS layer.

Next, and as shown in FIG. 3, a conventional mask 50 is employed to remove the dielectric capping layer and first polysilicon layer from the array region and thereafter nitride layer 40 is removed in the array region utilizing an etching process that is selective to oxide and silicon. It is noted that the dielectric capping and polysilicon layers are removed by utilizing a conventional lithography and a conventional etching step or a combination of steps which is (are) capable of stopping on the nitride layer.

A wordline stack which may comprise a WJWN or another metal conductor 54 capped by SiN or another dielectric material 56 are deposited in the array region and then patterned to form wordlines 52. It should be noted that although the wordlines are described and depicted as containing a W/WN conductor and a SiN cap the present invention is not limited to just those types of wordlines. Instead, all types of wordlines that are well known to those skilled in the art are contemplated herein. The wordline stack is formed utilizing conventional deposition processes including, but not limited to: CVD, plasma-assisted CVD, chemical solution deposition, plating, sputtering or other like deposition processes. The patterning of the wordline stack is achieved utilizing conventional lithography and etching. Spacers 58 which are composed of the same or different dielectric material as the wordline capping layer are then formed by conventional deposition and etching processes. It is noted that the above steps form the structure shown in FIG. 4 in which spacers 58 are present on the wordlines as well as the stack of polysilicon and dielectric capping layers present in the support region. Note that at the time of patterning the array wordlines, the stack thickness in both the array and supports are approximately coplanar.

Block mask 60 is then applied to the support regions to allow the removal of the TTO oxide layer over the bitline diffusion regions. Specifically, the block mask is formed utilizing conventional deposition processes and lithography. The TTO (24) in the array region is then removed utilizing an etching process which has a high-selectivity for removing oxide so as to provide the structure shown in FIG. 5. It is possible to eliminate block mask 60 if SIN is employed on top of the capping dielectric layer 44; in that case, ITO 24 may be removed maskless to SiN caps of the wordlines and supports.

Block mask 60 is then stripped from the support region, and an N+ doped polysilicon layer 62, which will subsequently become the bitline of the structure, is deposited by conventional deposition processes well known to those skilled in the art. For example, a conventional in-situ doping deposition process or deposition followed by ion implantation may be used in forming N+ polysilicon layer 62 along with an optional SiN cap. Using a block mask, not shown, the N+ doped polysilicon layer is removed by a conventional etching process from the support areas selective to the dielectric cap layer providing the structure shown in FIG. 6

Figure 6:
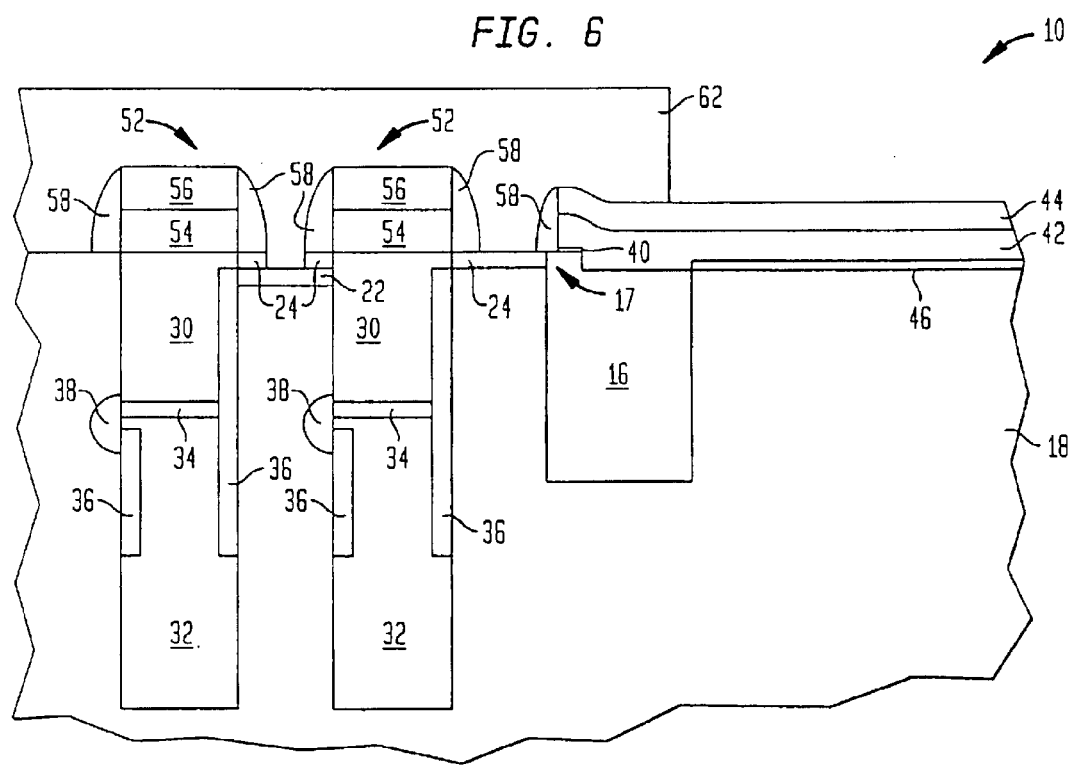
Figure 7:
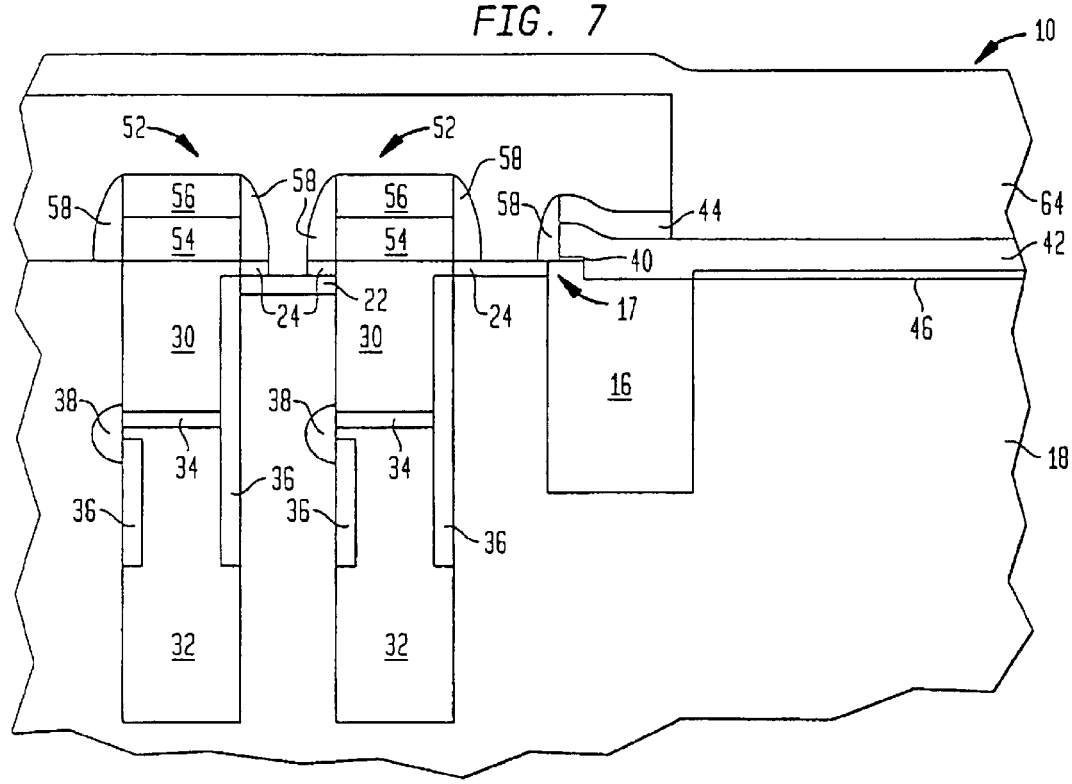

After stripping the block mask used in forming the structure shown in FIG. 6, the exposed dielectric cap in the support region is optionally removed selective to polysilicon. A doped glass layer 64 such as boron doped silicate glass is next deposited by conventional means so as to form the planar structure shown in FIG. 7. The SiN cap in the array prevents auto-doping of the N+ polysilicon by the BSG layer. Note that BSG may be replaced by phosphorus silicate glass (PSG) or arsenic doped silicate glass (ASG).

Figure 8:
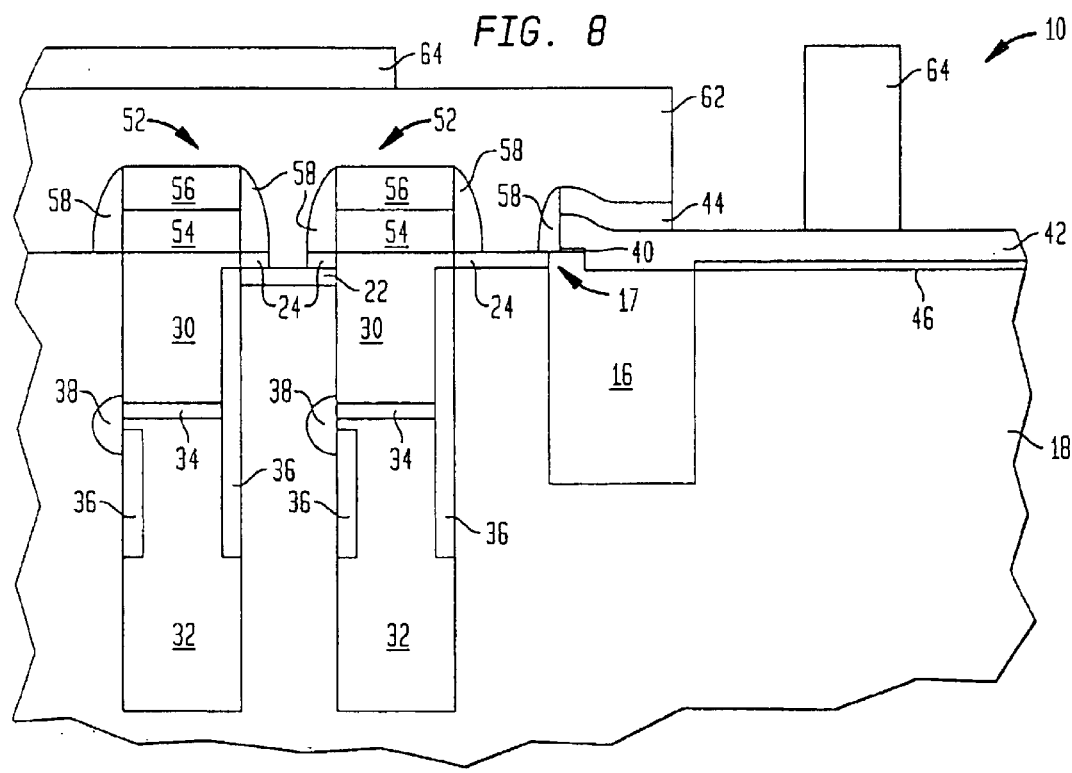

The doped glass layer and underlying TEOS layer in the supports is now patterned selective to silicon by a conventional reactive-ion etching (RIE) process so as to provide the structure shown in FIG. 8. It is noted that in an alternative embodiment of the present invention, the doped glass layer is replaced with a bilayer resist.

Figure 9:
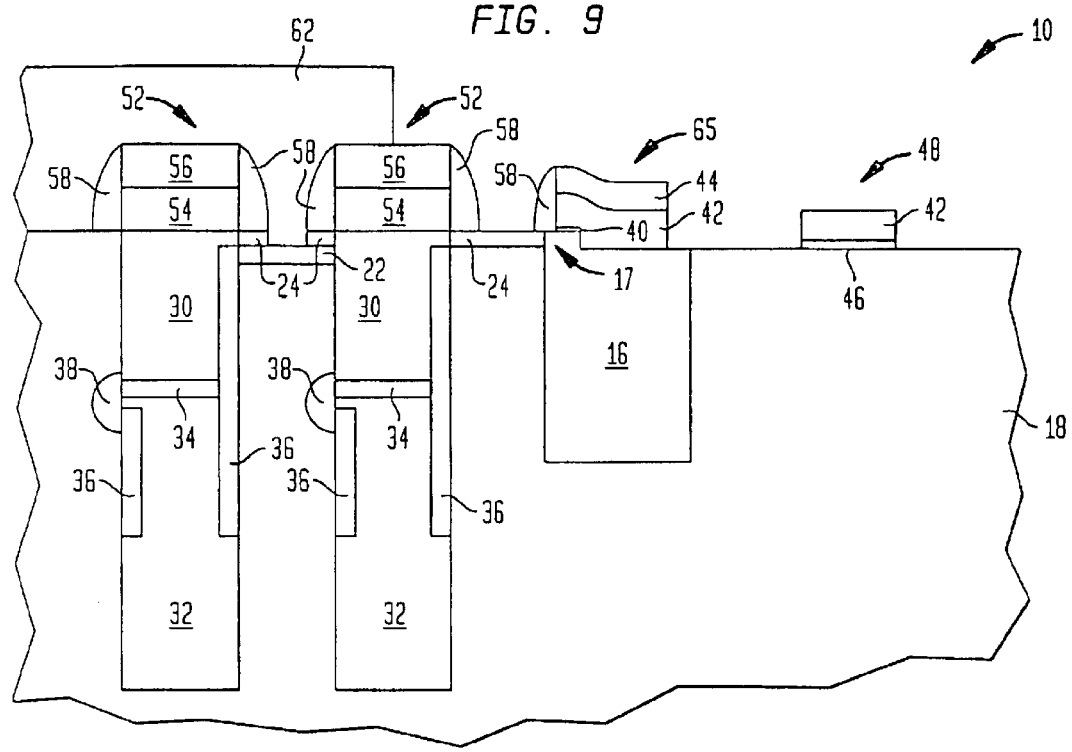

Next, using the patterned doped glass layer and underlying TEOS in the supports as a hard mask, the underlying polysilicon regions, i.e., bitline polysilicon in the array and first polysilicon layer in the support region, are patterned selective to $SiO_2$ so as to provide the structure shown in FIG. 9. Specifically, the bitline polysilicon is patterned into bitlines and the first polysilicon in the support region is patterned into a support gate region 48. The doped glass material layer is then removed using an etching process that is substantially selective to the TTO, dielectric capping and oxide layers. During this step of the process, the gate conductor guard ring 65 is formed in the memory structure.

Figure 10:
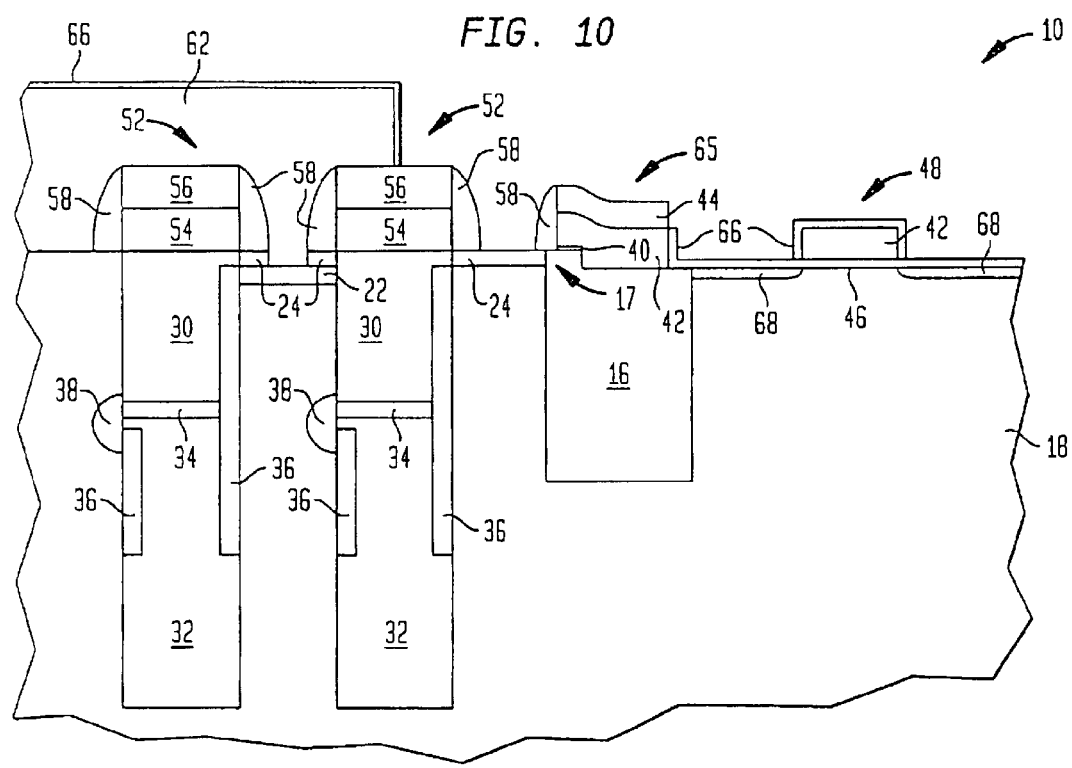

A thin screen oxide layer 66 is then formed by conventional deposition or thermal growing processes on the exposed poly and single crystal silicon surfaces, See FIG. 10. LDD (lightly doped diffusion) or extension source/drain implants regions 68 are then formed in predetermined regions of the substrate by conventional lithography and ion implantation, See FIG. 10. These implants are typically carried out using a low concentration of dopant dose on the order of $5 \times 10^{13} - 5 \times 10^{14}$ $cm^2$.

Figure 11:
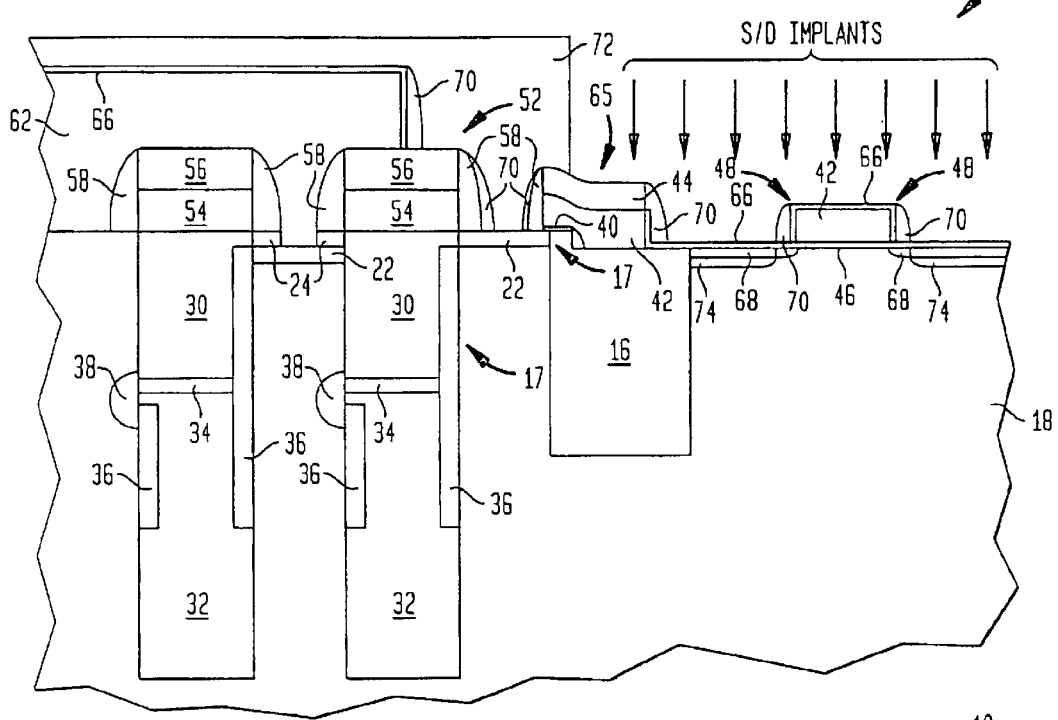
Figure 12:
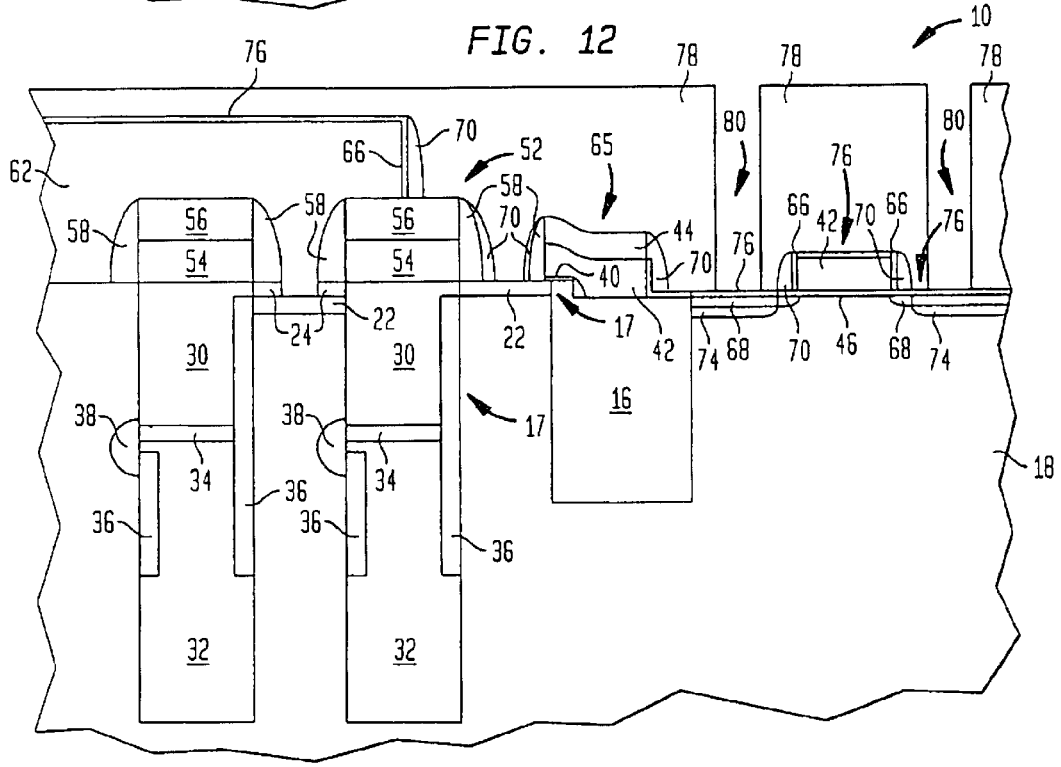

Next, additional spacers 70 composed of an insulator material such as SiN are then formed in the array and support regions by utilizing a conventional deposition process and etching, an appropriate photoresist mask 72 is then formed in the structure so as to selectively block the array regions and areas of the support are subjected to ion implantation so as to form source/drain regions 74, See FIG. 11 in the structure. It is noted that these implants set the workfunctions of the gate conductors in the support regions, and that prior to forming the source/drain regions, the screen oxide is removed from the structure utilizing a chemical etchant such as HF.

FIG. 11 includes a structure in which the exposed silicon surfaces thereof are subjected to a conventional salicidation process which is capable of forming salicided regions 76 in the structure. Specifically, salicide regions are formed on the bitline region, the support gate region and the source/drain region. Following the salicidation process, an interlevel dielectric material 78 such as a CVD oxide is deposited on the structure and then patterned and etched in the manner shown so as to form via openings 80 in the interlevel dielectric material. Conventional processes which are well known to those skilled in the art follow the formation of the vias in the structure.

The second embodiment of the present invention will now be described in more detail by referring to FIGS. 13–20. In the second embodiment of the present invention, a simplified process is employed which results in an array/support transition region which does not contain a gate conductor ring over the isolation region around the perimeter of the array. In this embodiment, the block mask used to protect areas outside the array during the removal of the TTO layer in the first embodiment (FIG. 5) is eliminated. Furthermore, the dielectric capping layer protecting the supports polysilicon is removed early in the process. This change results in improved planarity, eliminating the need for employing the planarizing doped glass material layer shown in FIG. 7. Thus, the support gate stack height which needs to be patterned is slightly reduced, resulting in improved linewith control.

The initial structure employed in this embodiment of the present invention is similar to that shown in FIG. 1 except that the isolation region extends into a portion of one of the DRAM cells in the array region, See FIG. 13. Nitride layer 40, support gate oxide 46, first polysilicon layer 42 and dielectric capping layer 44 are formed as described above providing the structure shown in FIG. 13.

As described above, standard mask 50 formed by lithography and etching is used to remove the dielectric capping layer and the first polysilicon layer from the array so as to provide the structure shown in FIG. 14. Exposed portions of the nitride layer in the array region are thereafter removed selective to oxide and silicon.

Figure 15:
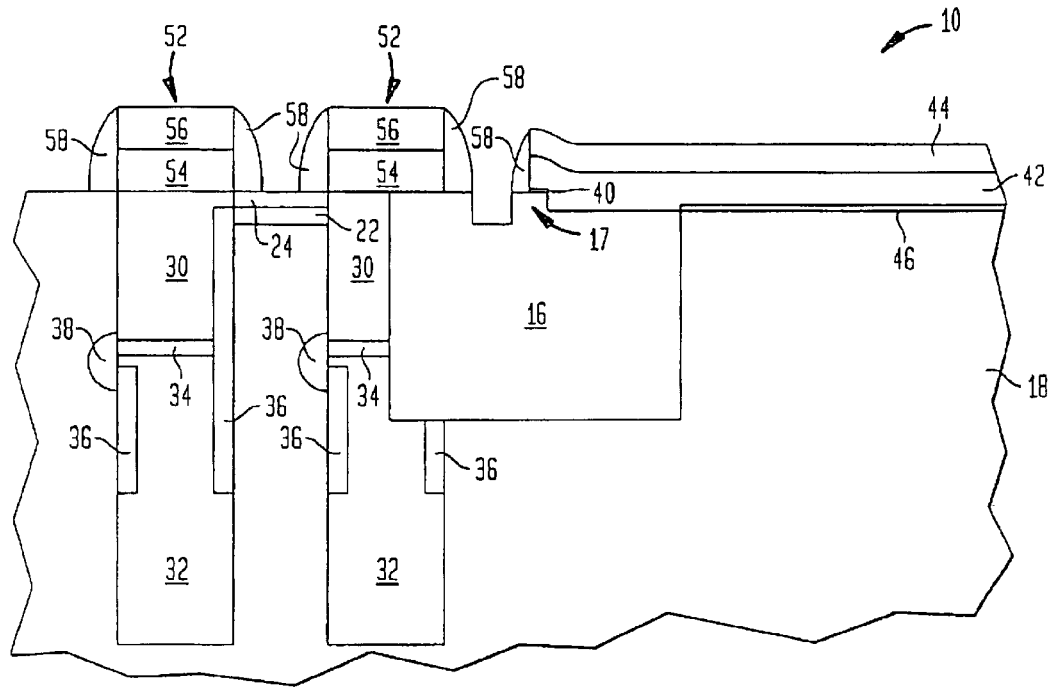

After removal of the exposed nitride layer, a wordline gate stack consisting of W/WN 54 capped with SiN 56 is deposited and patterned to form wordlines 52, see FIG. 15. This figure also shows the presence of insulating spacers 58 which are formed in the conventional manner described hereinabove.

Figure 16:
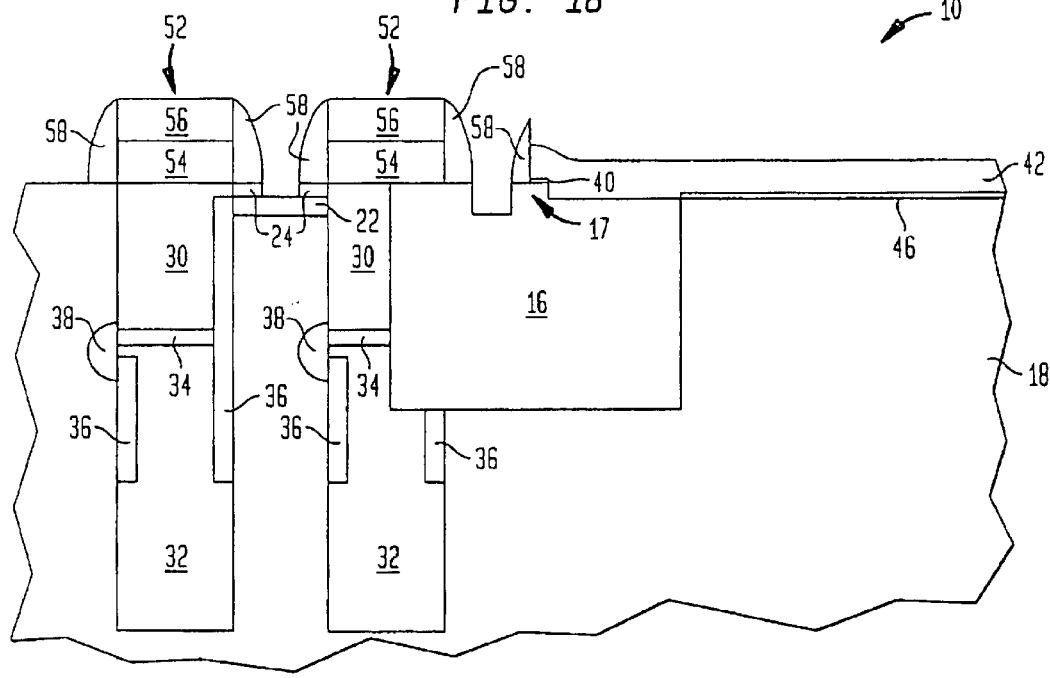

FIG. 16 shows the structure after an anisotropic etching process is used to remove the exposed TTO in the array region and the dielectric capping layer from the first polysilicon layer in the support region. This etching step also results in etching into the top of the exposed portion of isolation region 16.

FIG. 17 shows the structure after a conformal layer of undoped polysilicon 61 is deposited on the structure. The undoped polysilicon layer is deposited utilizing conventional means well known to those skilled in the art such as CVD, plasma assisted CVD, chemical solution deposition and other like deposition processes.

The undoped polysilicon layer provided in FIG. 17 is then patterned so as to simultaneously form the support gate region 48 and the bitline in the array region, See FIG. 18. A thin screen oxide 66 is then grown utilizing a conventional growing process such as thermal oxidation well known to those skilled in the art. The thin screen oxide layer of the present invention typically has a thickness of from about 1 to about 10 nm. LLD regions are formed about the gate region in the support region using lithography and implantation.

Figure 19:
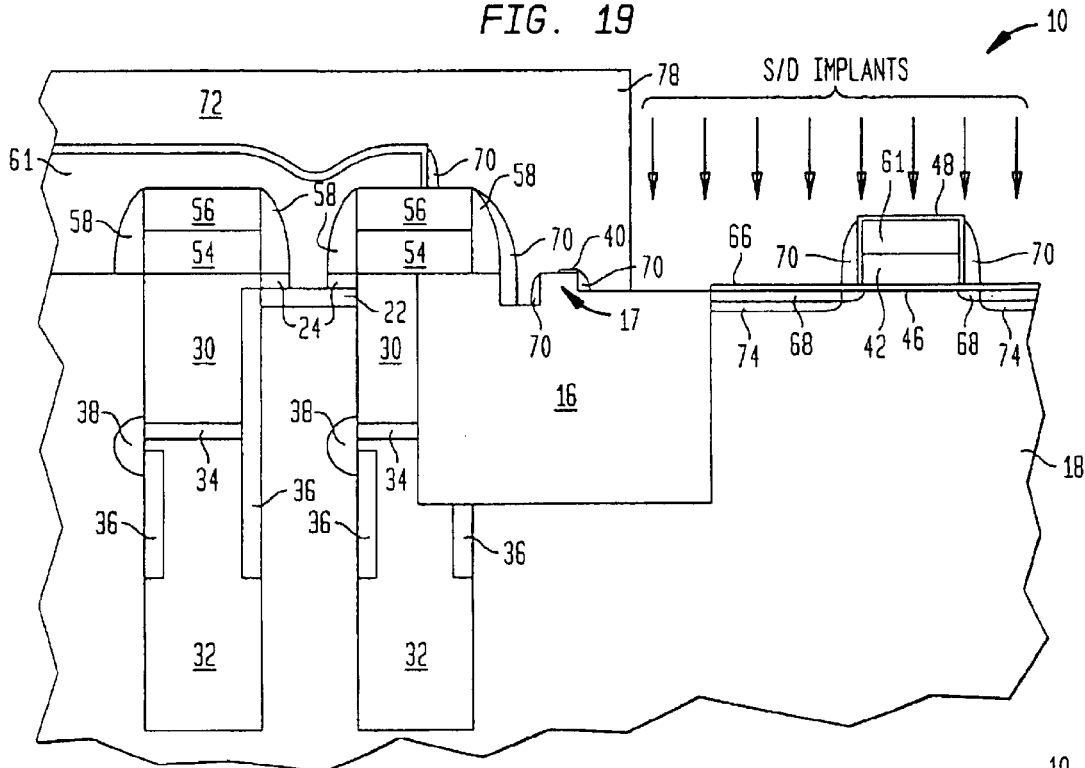

Additional SiN spacers 70 are then formed, appropriate resist block mask 72 is applied to sequentially block the array and areas of the supports, and source/drain regions 74 are thereafter formed by ion implantation or thermal diffusion. These implants, which are shown in FIG. 19, set the workfunction of the gate conductors in the supports and also dopes bitline polysilicon 61 in the supports so as to form doped polysilicon region 63 therein.

Figure 20:
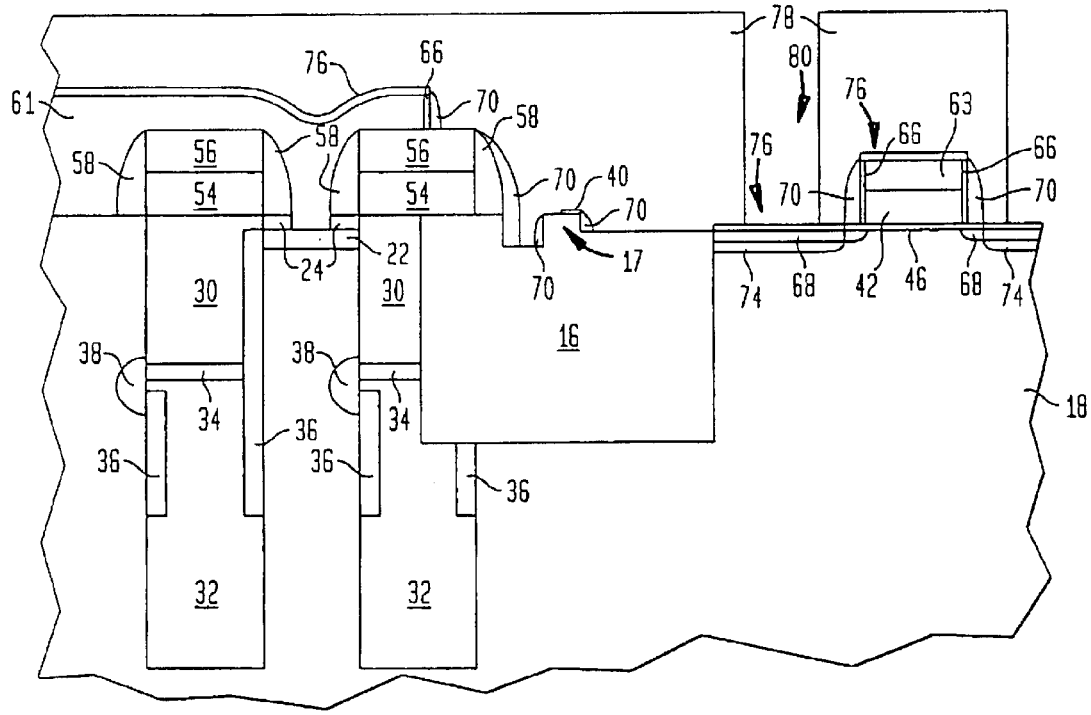

FIG. 20 shows the structure which is obtained after the following processing steps are performed: Following the source/drain, dual workfunction and bitline implants and removal of the screen oxide, the exposed silicon surfaces are salicided utilizing conventional salicidation processing steps well known to those skilled in the art so as to form salicide regions 76 in the structure. Interlevel dielectric 78 is thereafter deposited and patterned so as to form via openings 80 therein.

The third embodiment of the present invention which forms a local interconnect wiring level which is consistent with the process steps described in the previous two embodiments will now be described in detail with reference to FIGS. 21–27.

Figure 21:
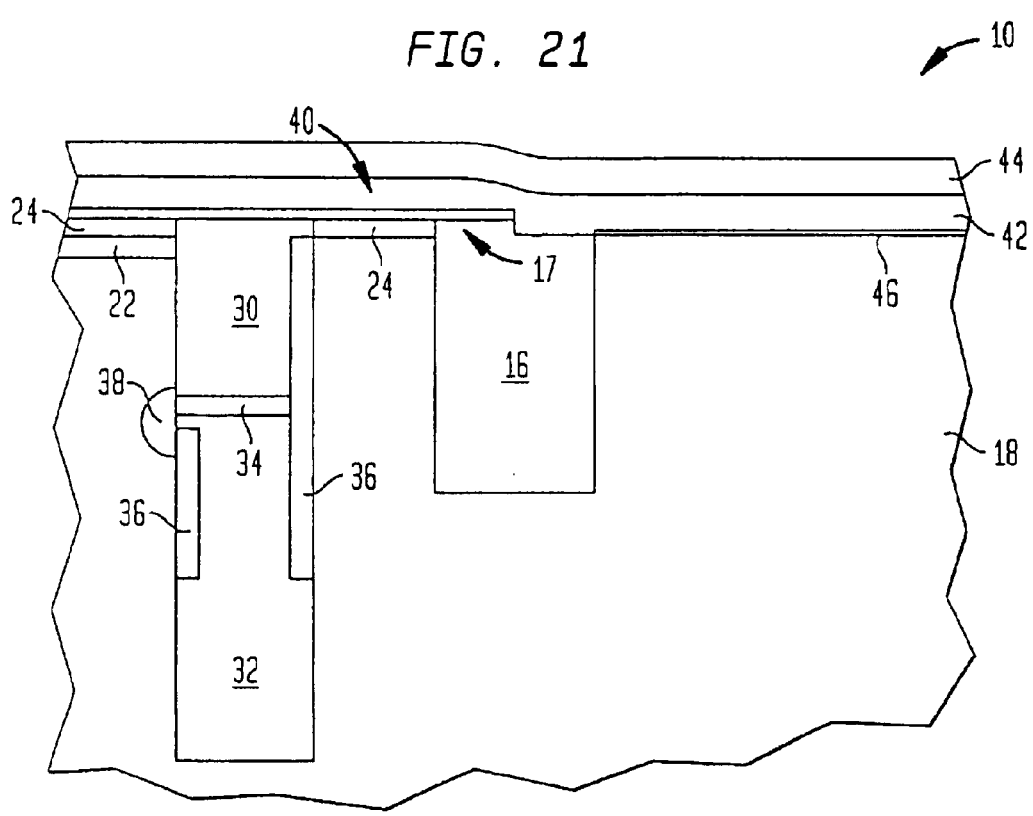
Figure 22:
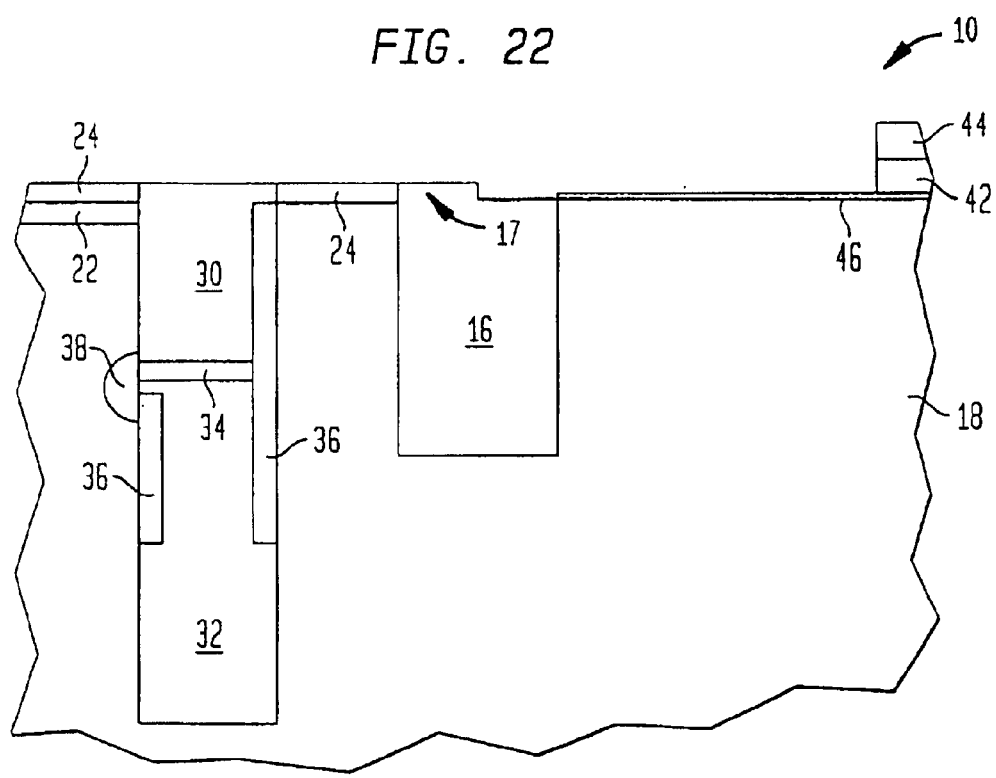

First, the structure shown in FIG. 21 is provided utilizing the processing steps mentioned hereinabove. A standard mask (formed by standard lithography and etching), not shown, is used to remove the dielectric capping layer and first polysilicon layer from the array and thereafter the nitride in the array region is removed so as to provide the structure shown in FIG. 22.

A local interconnect mask 82 is then formed on the structure utilizing conventional lithography and etching which are both well known to those skilled in the art and is used to selectively open oxide layer 46 which receive subsequent implants for the interconnect contact areas, See FIG. 23.

Following the interconnect implant which is carried out utilizing conventional ion implantation processes well known to those skilled in the art, the expose gate oxide 46 is removed, See FIG. 24. The local photoresist is removed and the process steps described above in forming the wordline conductors and spacers is employed forming the structure shown in FIG. 24. The interconnect diffusion is labeled as 92 and local interconnect is labeled as 94. Note the local interconnect is comprised of the same material as the wordlines.

Figure 25:
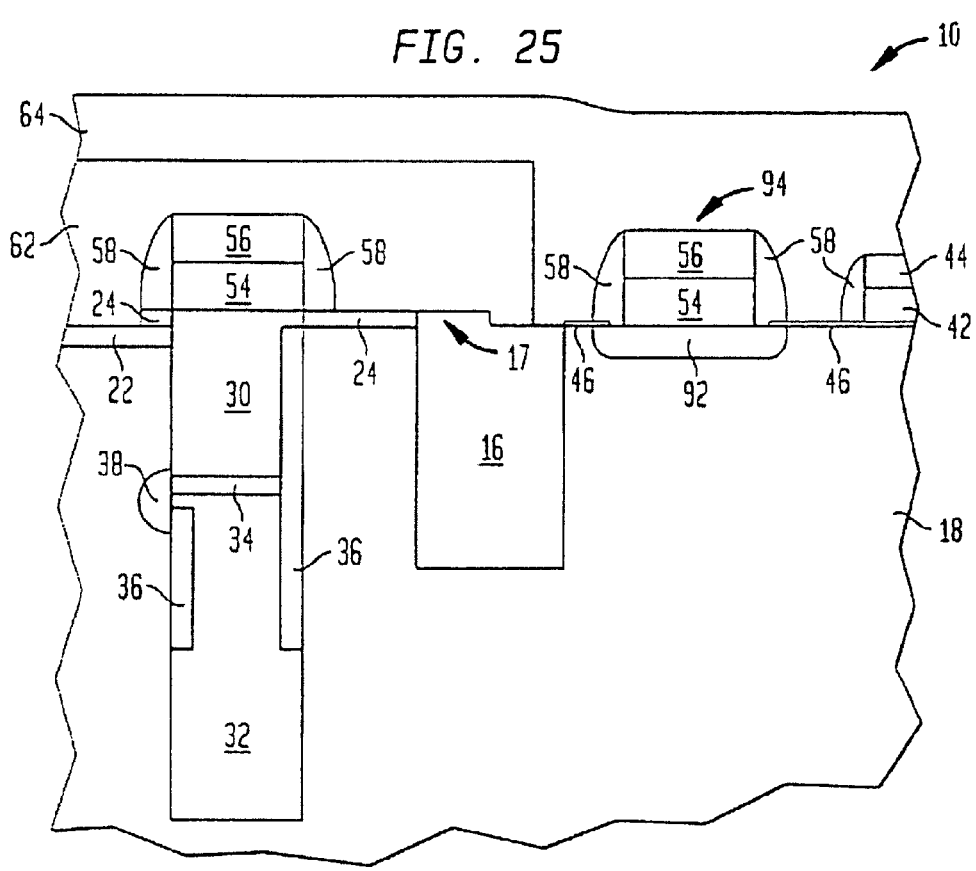

Processing steps as described in the first embodiment continues with the deposition of the polysilicon bitline contact layer, opening of this layer and deposition of the planarizing doped glass material so as to provide the structure shown in FIG. 25.

Figure 26:
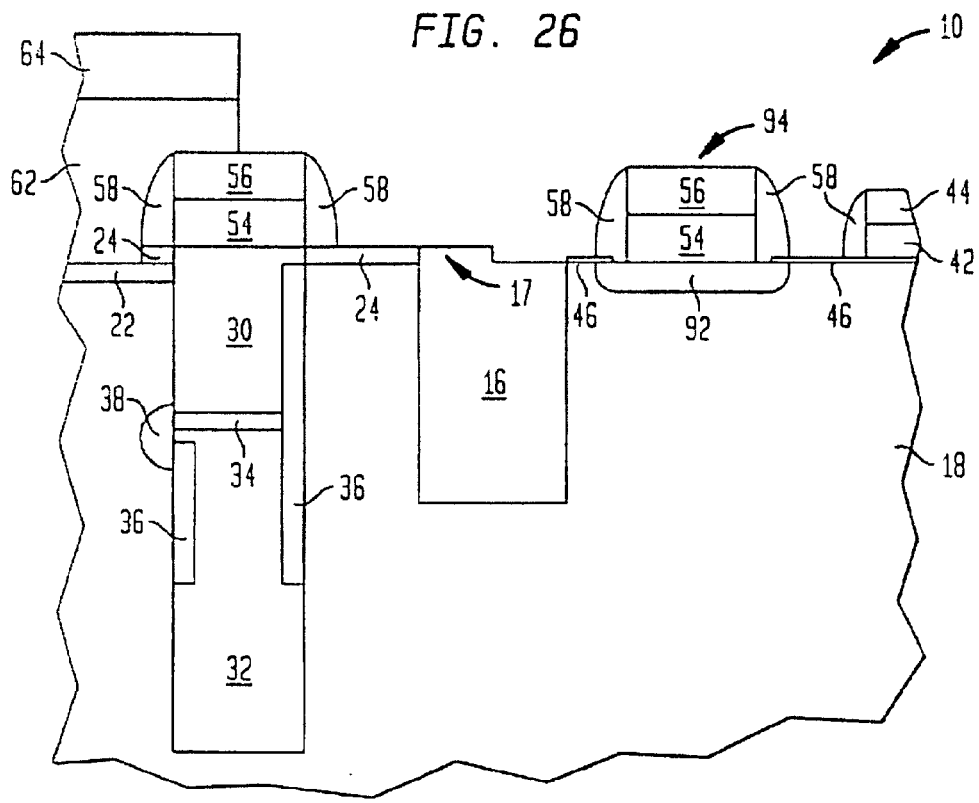
Figure 27:
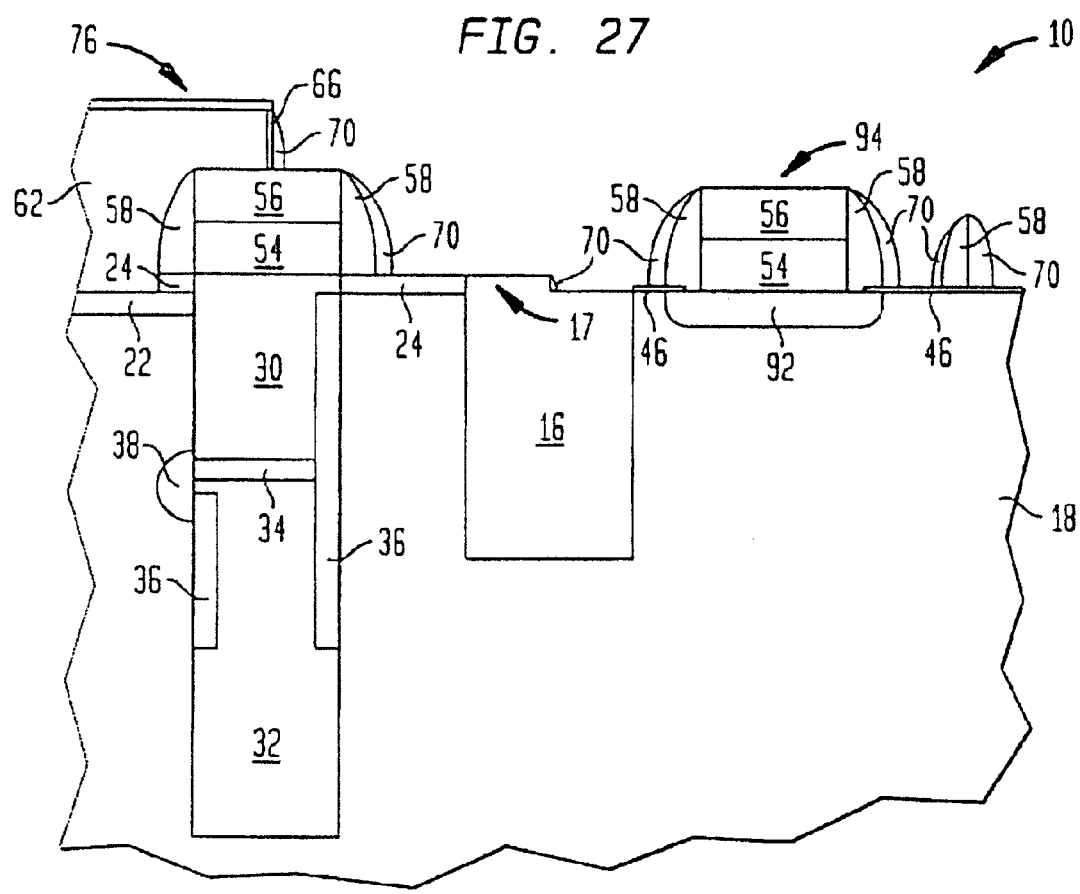

FIG. 26 shows the structure after bitline and support gates are patterned and FIG. 27 shows the structure after salicidation. The local interconnects may be used to electrically connect regions of substrate over isolation oxide 16 using wordline conductor 54.

It is noted that the various embodiments of the present invention which are described above and which are depicted in greater detail in FIGS. 1–27 provide the following advantages over the existing art:

1. Dual workfunction process saves two deep—UV masks relative to conventional processing;

1a. Common shared gate conductor/array 3F pitch bitline masking step for improved lithography using 248 nm, and 1b. Shared bitline conductor/contact process.

2. Decoupled array and support processing (independent support gate conductor and wordline lithography).

3. Provides salicided gates and source/drain support MOSFETs in a vertical MOSFET EDRAM process.

4. Salicided bitline conductor.

5. Provides local interconnects with the addition of a masking step.

While this invention has been particularly shown and described with respect to preferred embodiments thereof, it will be understood be those skilled in the art that the foregoing and other changes in forms and details may be made without departing from the scope and spirit of the present invention. It is therefore intended that the present invention not be limited to the exact forms and details described and illustrated but fall within the scope and spirit of the appended claims.

Having thus described our invention in detail, what we claim as new and desire to secure by the Letter Patent is:

1. A dual workfunction high-performance support MOSFET/EDRAM array comprising at least one support region and at least one array region, said array region and said support region being separated by an isolation region and at least a gate conductor guard ring formed around said array region on top of said isolation region, wherein said gate conductor guard ring prevents trapping of a stringer of gate conductor polysilicon on said isolation region.

2. The dual workfunction high-performance support MOSFET/EDRAM array of claim 1 wherein said array region includes a plurality of DRAM cells embedded in a semiconductor substrate.

3. The dual workfunction high-performance support MOSFET/EDRAM array of claim 2 wherein wordlines overlay each of said DRAM cells and a bitline overlays said wordlines.

4. The dual workfunction high-performance support MOSFET/EDRAM array of claim 2 wherein each of said DRAM cells are vertical DRAMs.

* * * * *